US007532508B2

United States Patent
Fuji (10) Patent No.: US 7,532,508 B2
(45) Date of Patent: May 12, 2009

(54) SEMICONDUCTOR MEMORY DEVICE HAVING PHASE CHANGE MEMORY CELLS ARRANGED IN A CHECKER MANNER

(75) Inventor: Yukio Fuji, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 292 days.

(21) Appl. No.: 11/623,677

(22) Filed: Jan. 16, 2007

(65) Prior Publication Data

US 2007/0171706 A1 Jul. 26, 2007

(30) Foreign Application Priority Data

Jan. 25, 2006 (JP) ............... 2006-016484

(51) Int. Cl.
*G11C 11/00* (2006.01)
(52) U.S. Cl. ........................ 365/163; 365/63
(58) Field of Classification Search ................. 365/163, 365/63
See application file for complete search history.

(56) References Cited

U.S. PATENT DOCUMENTS

| 7,053,431 | B2 | 5/2006 | Ogiwara |
| 7,208,751 | B2 * | 4/2007 | Ooishi ........................ 257/5 |
| 7,372,726 | B2 * | 5/2008 | Matsuoka et al. ........... 365/163 |
| 7,405,965 | B2 * | 7/2008 | Choi et al. ................... 365/163 |
| 2004/0051094 | A1 | 3/2004 | Ooishi |
| 2007/0159878 | A1 * | 7/2007 | Choi et al. ................... 365/163 |
| 2007/0279962 | A1 * | 12/2007 | Nirschl et al. ............... 365/148 |
| 2008/0130352 | A1 * | 6/2008 | Scheuerlein ................. 365/163 |
| 2008/0137403 | A1 * | 6/2008 | Matsuoka et al. ........... 365/163 |
| 2008/0266941 | A1 * | 10/2008 | Lee et al. ..................... 365/163 |

FOREIGN PATENT DOCUMENTS

| JP | 2004-110867 A | 4/2004 |
| JP | 2005-71500 A | 3/2005 |
| JP | 2005-150243 A | 6/2005 |

* cited by examiner

*Primary Examiner*—Tuan T. Nguyen
(74) *Attorney, Agent, or Firm*—Sughrue Mion, PLLC

(57) ABSTRACT

A memory cell has a heater element which generates heat by supplying electric current, a chalcogenide layer whose phase is changed by applying heat, and two transistors for driving the heater element. Bit lines extend in a predetermined direction and electrically connect with memory cells. Word lines extend at right angles to bit lines and electrically connect with memory cells. In a first cell row, memory cells are arranged at interval 2$d$ along the bit lines. In a second row, memory cells are arranged such that the first cell row is shifted by distance d along the bit lines. First cell rows and second cell rows are alternately arranged at an interval e along the direction of word line so as to arrange the memory cells in a checker manner.

12 Claims, 7 Drawing Sheets

CROSS SECTION OF X-Y

| RA-CA | 00-0 | 00-1 | 01-0 | 01-1 | 10-0 | 10-1 | 11-0 | 11-1 |
|---|---|---|---|---|---|---|---|---|
| W0U | H | L | L | L | L | L | L | L |
| W0L | H | H | L | L | L | L | L | L |
| W1U | L | H | H | L | L | L | L | L |
| W1L | L | L | H | H | L | L | L | L |
| W2U | L | L | L | H | H | L | L | L |
| W2L | L | L | L | L | H | H | L | L |
| W3U | L | L | L | L | L | H | H | L |
| W3L | L | L | L | L | L | L | H | H |
| W3LL | L | L | L | L | L | L | L | H |

FIG. 7A

RELATED ART

FIG. 7B

RELATED ART

CROSS SECTION OF P–Q

SEMICONDUCTOR MEMORY DEVICE HAVING PHASE CHANGE MEMORY CELLS ARRANGED IN A CHECKER MANNER

FIELD OF THE INVENTION

This invention relates to a semiconductor memory device and, more specifically, to a semiconductor memory device comprising a phase-change element.

BACKGROUND OF THE INVENTION

A phase-change memory as one of programmable memories with a resistor is a nonvolatile memory which makes use of the behavior that applying heat to a material of chalcogenide series (Ge, Sb, Te) produces transition between an amorphous phase (high resistance) and a crystalline phase (low resistance). Although the phase change generally occurs due to Joule's heat generated by electric current and energization time between the high resistance state (Reset) and the low resistance state (Set), the writing speed of the phase-change memory is faster than that of the flash memory. The phase-change memory has been developed in view of substitution for DRAM or SRAM as an application of the phase-change memory.

The phase-change memory is designed by arranging memory cells having phase-change elements in a matrix form and by laying-out bit lines and word lines at right angles each other so that a desired memory cell can be accessed (See, for example, Patent Document 1 and Patent Document 2).

In the phase-change memory, as the memory cells become finer and finer, the driving current performance of the memory cell transistor decreases, resulting in instable data writing. As a means to increase the driving current of the transistor, the effective channel width W is widened. For example, Patent Document 3 discloses a nonvolatile semiconductor memory device in which two field-effect transistors are disposed along both sides of a memory cell contact as switching transistors of a switching element.

Figure 7A:
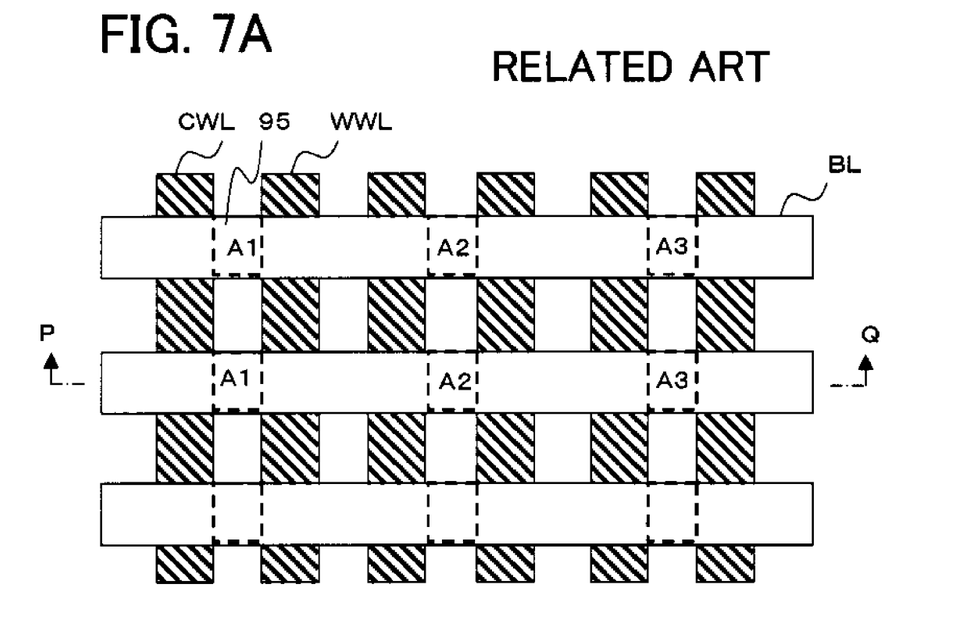
FIG. 7A is a plan view to explain a structure of a conventional phase-change memory (Related Art).
Figure 7B:
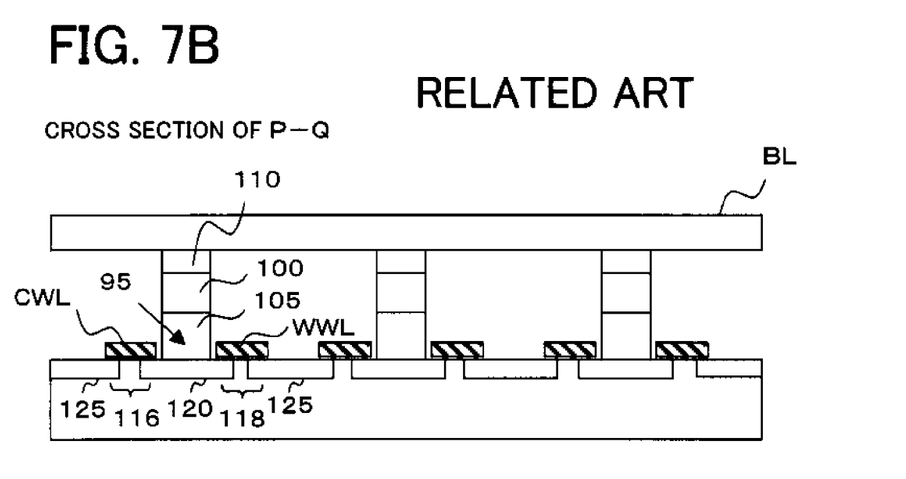
FIG. 7B is a sectional view along a 7B-7B line in FIG. 7A.

FIGS. 7A and 7B show a layout to explain a structure of the phase-change memory disclosed in Patent Document 3. FIG. 7A is a plan view, and FIG. 7B is a cross-sectional view taken along a P-Q line of FIG. 7A. In FIGS. 7A and 7B, the phase-change memory cell comprises a memory cell contact 95 having a contact layer 110, a chalcogenide layer 100 and a heater layer 105 and switching transistors 116, 118. The memory cell contact 95 electrically connects a drain region 120 shared in common by the switching transistors 116, 118 to a bit line BL. The switching transistor 116 uses a word line CWL as a gate and shares a source region 125 with an adjacent transistor. The switching transistor 118 uses a word line WWL as a gate and shares the source region 125 with the adjacent transistor. The switching transistors 116, 118 are arranged in a row along both the sides of the memory cell contact 95 and turn on at writing time to pass data writing current. A gate width twice as wide as the dimension of the memory cell can be secured in the entire switching transistor, a driving current performance enough for the data writing can be obtained even though the memory cells are made smaller.

[Patent Document 1]
Japanese Patent Kokai Publication No. JP-P2004-110867A

[Patent Document 2]
Japanese Patent Kokai Publication No. JP-P2005-150243A

[Patent Document 3]
Japanese Patent Kokai Publication No. JP-P2005-071500A

SUMMARY OF THE DISCLOSURE

According to the conventional phase-change memory, there is a probability that the heat to a memory cell in the writing affects the phases of the adjacent memory cells for which writing has finished already. Specifically, the finer the memory cell becomes for improving the integration, the larger the affect becomes. There may be therefore probability that the data in the adjacent memory cells is changed to false data.

Now, the layout of a memory cell shown in FIG. 7A explained above will be analyzed. With regard to positions A1, A2, A3 ... in FIG. 7A, two word lines CWL, WWL are disposed between A1 and A2, between A2 and A3 ..., respectively. On the other hand, a distance between the positions A1-A1 of the adjacent memory cells arranged in a direction along which the word lines extend is a distance between the bit lines. In a semiconductor device, when F stands for a design factor, the width of the line and the distance between the lines are generally designed as a multiple of F for layout. The distance between the positions A1-A2 therefore becomes twice as the distance between the positions A1-A1. The adjacent memory cells disposed along the extending word line (for example, A1 and A1) are more strongly affected by the heat disturbance.

According to one aspect of the present invention there is provided a semiconductor memory device comprising memory cells each having a heater element which generates heat by supplying an electric current and a variable resistor element whose phase is changed by heat; bit lines each extending in a predetermined direction and electrically connecting with the memory cells; and word lines each extending in a direction at right angles to the bit lines and electrically connecting with the memory cells. The memory cells are arranged in a checker manner.

The semiconductor memory device according to a first mode may comprise first cell rows in which the memory cells are arranged at a predetermined interval $2d$ along the extending direction of the bit lines; and second cell rows in which the memory cells are arranged such that the first cell row is shifted by a distance d along the extending direction of the bit lines. The first cell rows and the second cell rows are alternately arranged at a predetermined interval e along the extending direction of the word lines.

In the semiconductor memory device according to a second mode, it is preferred that the interval $2d$ is equal to or greater than the interval e.

In the semiconductor memory device according to a third mode, it is preferred that two or more word lines are arranged within the interval $2d$.

In the semiconductor memory device according to a fourth mode, it is preferred that a first word line and second word line of the word lines are arranged within the interval $2d$ (inclusive). The memory cell disposed sandwiched between the first and second word lines is connected with the first and second word lines. Writing into the memory cells being performed through both the first and second word lines, readout from the memory cells being performed through any one of the first and second word lines.

In the semiconductor memory device according to a fifth mode, it is preferred that the memory cell further comprises first switch element and a second switch element for switching power supply to the heater element; a controlling terminal of the first switch element being connected with the first word line, a controlling terminal of the second switch element being connected with the second word line, the power being supplied through the bit line.

In the semiconductor memory device according to a sixth mode, it is preferred that the semiconductor memory device further comprises a word line driver for driving the memory cells through the word lines; the word line driver comprising a first decoder decoding one bit in a row address and column address to access the memory cell selectively and outputting a signal to select one of the first word lines and a second decoder decoding the row address and outputting a signal to select one of the second word lines when a writing signal is active.

In the semiconductor memory device according to a seventh mode, it is preferred, when the row address is k (k=0 to $2^n-1$, n is an integer greater than 1); the numbers of the first word lines are 0 to $2^n$, respectively, and the numbers of the second word lines are 0 to $2^n-1$; respectively. The first decoder outputs a selection signal to the first word line having any one of the numbers k and k+1 corresponding to 1 bit in the column address, the second decoder outputting a selection signal to the second word line having a number k.

The meritorious effects of the present invention are summarized as follows.

The influence of the heat disturbance on the adjacent memory cells can be reduced to prevent an error in writing, when data is written in a memory cell, by arranging the adjacent memory cells disposed along the extending direction of word lines so as to keep away from one another.

PREFERRED MODES OF THE INVENTION

Figure 1A:
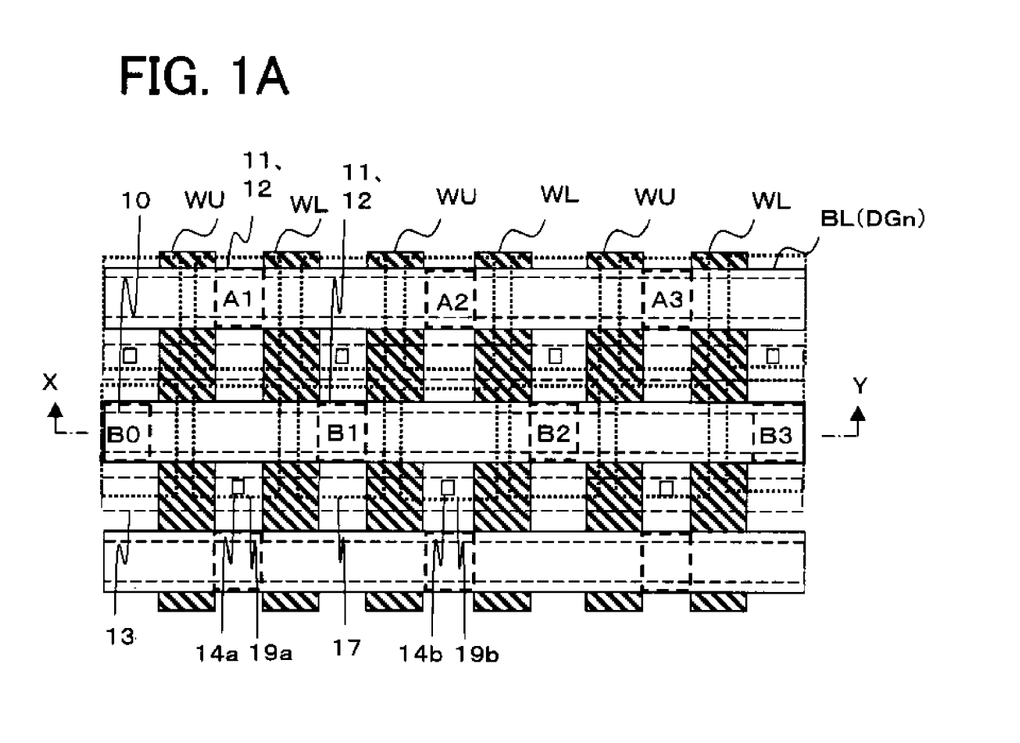
FIG. 1A is a plan view illustrating a structure of a semiconductor memory device according to one example of the present invention.
Figure 1B:
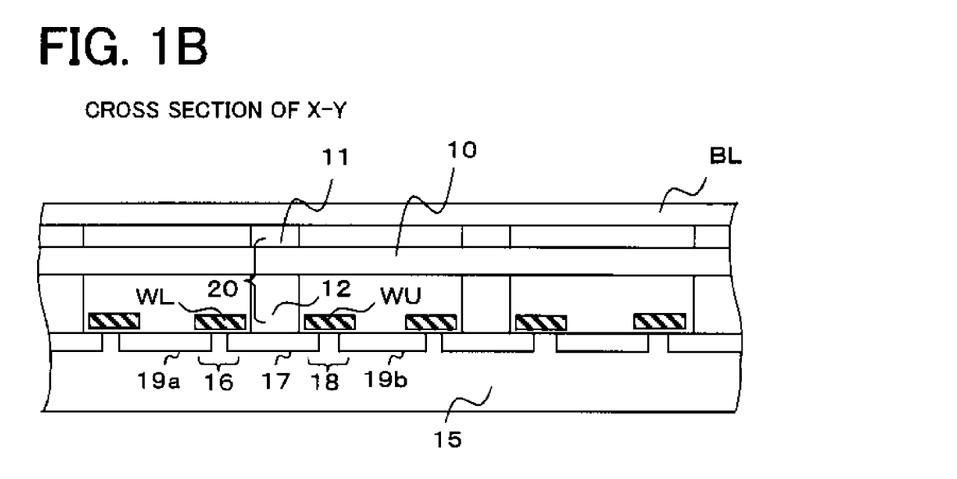
FIG. 1B is a sectional view along a 1B-1B line in FIG. 1A.

FIG. 1A is a plan view illustrating a structure of a semiconductor memory device according to an example of the present invention. FIG. 1B is a cross sectional view taken along a X-Y line in FIG. 1A. In FIG. 1A, a semiconductor memory device comprises bit lines BL, word lines WL, WU expending so as to intersect with the bit lines BL at right angles, and phase-change memory cells each electrically connecting with the bit lines BL and the word lines WL, WU. The phase-change memory cell is comprised by a unit cell including a memory cell contacts 20 having a contact layer 11, a chalcogenide layer 10 and a heater element 12 and transistors 16, 18 for driving the memory cell contact 20.

The transistors 16, 18 are formed on a semiconductor substrate 15 and share a drain region 17. The drain region 17 is connected with the bit line BL through the heater element 12, the chalcogenide layer 10 and the contact 11. The transistor 16 uses the word line WL as a gate and a source region 19a shared with an adjacent transistor is connected with a source potential line 13 through a source contact 14a. The transistor 18 uses the word line WU as a gate and a source region 19b shared with an adjacent transistor is connected with the source potential line 13 through a source contact 14b. Both transistors 16, 18 are turned on for a predetermined period of time when data is written in the memory cells, and only one of transistors 16, 18 is turned on for a predetermined period of time when data is read out. The source potential line 13 extends in parallel with the bit lines BL in a layer different from the layers of the bit lines BL and the word lines WL, WU.

Figure 2:
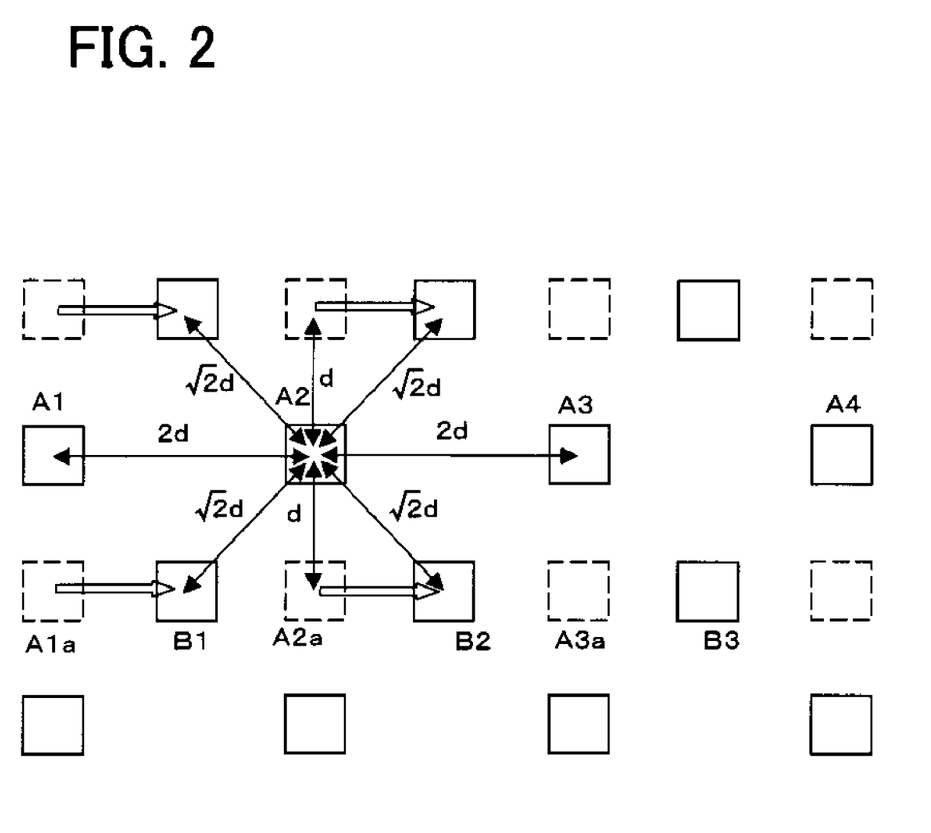
FIG. 2 is a figure schematically illustrating a layout of a memory cell contact in a semiconductor memory device according to one example of the present invention.

FIG. 2 is a figure schematically illustrating the layout of the memory cell contact in the semiconductor memory device as structured above. In FIG. 2, there are first cell rows in which the memory cell contacts are arranged at the positions A1, A2, A3 . . . at a predetermined interval 2d (measured by center to center of the cells) along an extending direction of the bit lines BL, and second cell rows in which the memory cell contacts are arranged at the positions B1, B2, B3 . . . shifted by the distance d from the first cell rows d along the extending direction of the bit lines BL. The first and second cell rows are alternately arranged at a predetermined interval d along the extending direction of the word lines WL, WU so as to arrange the memory cell contacts in a checker manner.

In this arrangement, the positions, for example A2 and B2, of the adjacent memory cell contacts are at least $2^{1/2}$ d away from each other. The distance is increased by 1.4 times as compared with the conventional distance d between the adjacent positions, for example between A2 and A2a, of the memory cell contacts. The influence of the heat disturbance by the heat generated by the heater element 12 on the adjacent memory cells can be reduced as compared with the conventional device.

The above explains the affect on the peripheral memory cells when data is written in the cell at the position A2. According to the conventional type, the position A2 is also easily affected by the heat generation of eight positions, specifically of the upper and lower adjacent cells, and there is thus a high probability of changing to an error data, when the writing is performed in the cells neighboring around the position A2. On the other hand, in the arrangement of the memory cells shown in FIG. 2, there is less influence of the heat since the memory cells are kept further away from each other and the number of the peripheral (neighboring) heater elements is reduced to 6. With the miniaturization, even if the distance between the bit lines becomes narrower, the influence by the adjacent heaters can be reduced.

When data is written in the memory cells, two word lines WL, WU at both sides of a memory cell contact become a high level to turn both transistors 16, 18 on. Both transistors 16, 18 then supply a writing current to the memory cell contact 20, and the heater element 12 generates heat to produce the phase-change of the chalcogenide layer 10. According this example, a large writing current can be secured by two transistors 16, 18 to perform stable writing. Since the adjacent memory cell contacts are apart from one another, an error of writing into the written cells caused by the heat disturbance at the time of writing can be prevented.

When the readout from the memory cell is performed, only one of two word lines turns to a high level and only the transistor 18 turns on to reduce the readout current flowing into the chalcogenide layer 10. This prevents the heat generation of the heater element 12 to prevent the readout current from destroying the memory data.

The chalcogenide layer 10 has a linear form disposed under the bit lines BL in the above structure and, however, may have a film form disposed on the entire may be disposed only at a part which is in contact with the contact 11.

EXAMPLE 1

Figure 3:
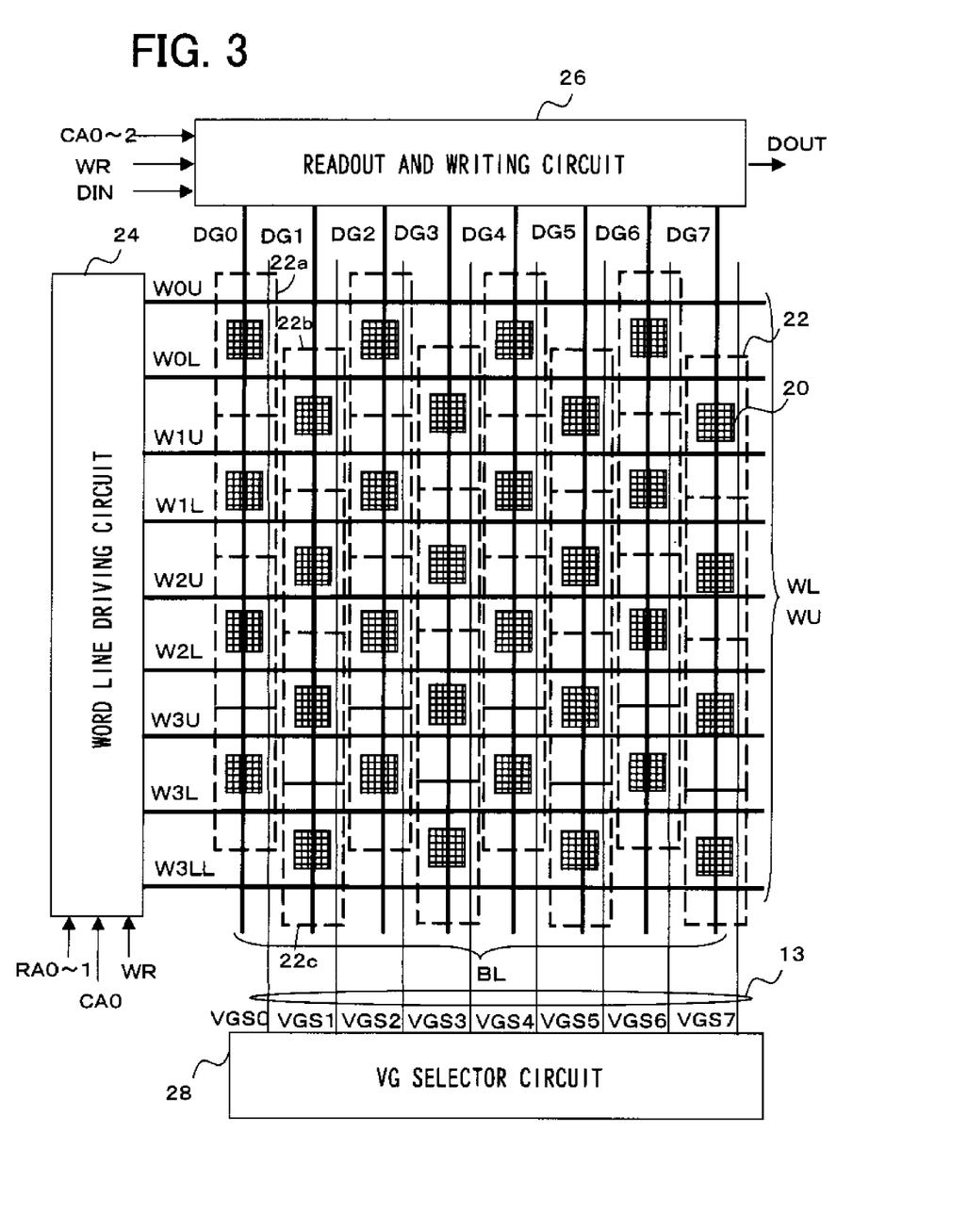
FIG. 3 is a block diagram illustrating a circuit structure of a semiconductor memory device according to an example of the present invention.

FIG. 3 is a block diagram illustrating a circuit structure of a semiconductor memory device according to an example of the present invention. In FIG. 3, the semiconductor memory device comprises memory cell contacts 20 explained above, unit cells 22 (22a, 22b, 22c) each having the memory cell contact 20, a word line driving circuit 24, a readout and writing circuit 26 and a VG selector circuit 28.

The word line driving circuit 24 decodes row address signals RA0, RA1, a column address signal CA0 and a write-enable signal WR, which are input to select a memory cell, and turns predetermined word line signals WjL, WiU (i, j=0-3) or a word line signal W3LL active (high level). At the time of the writing in the memory cell, signals of two adjacent word lines (the word line signals W0U, W0L, for example) arranged over and under the memory cell contact 20 are turned high level. At the time of the readout from the memory cell, only a signal of one word line (the word line signal W0U, for example) is turned to high level. The word line driving circuit 24 will be explained below in detail.

The readout and writing circuit 26 is a previously known circuit having a sense amplifier and write amplifier. At the time of the writing in the memory cell, the readout and writing circuit 26 decodes input column address signals CA0-CA2 and write-enable signal WR, turns a predetermined bit line BL active, and writes a data input signal DIN in the memory cell contact 20 of the unit cell 22 which is located at an intersection point of the bit line with the active word lines. At the time of the readout from the memory cell, that is, when the write-enable signal WR is not active, the readout and writing circuit 26 reads out data from the memory cell contact 20 of the unit cell 22, which is located at the intersection point, through the bit line BL and outputs a data output signal DOUT.

The VG selector circuit 28 turns a predetermined source potential line SL active, turns the source of the transistor, connected with the source potential line SL, in the unit cell 22 low-level and activates the transistor. Signals (VGS0-VGS7) of all the source potential lines SL may be turned low-level.

The above structure shows an example having two row addresses, three column addresses and 4×8=32 memory cells for the simplicity of illustration, but the present invention is not limited to this example. Each number of the row addresses, column addresses and memory cells to be arranged is determined by the size of the memory.

Figure 4:
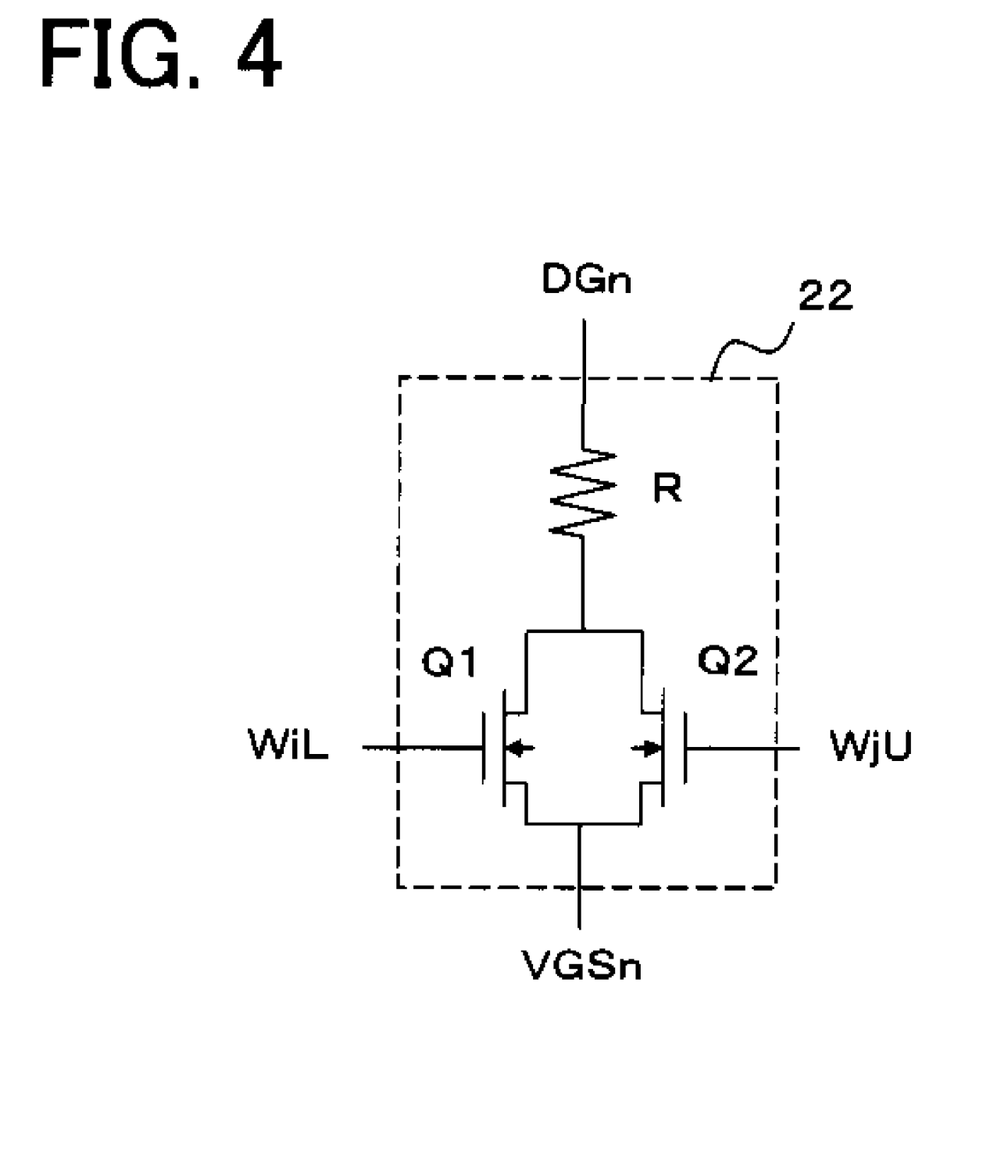
FIG. 4 is a figure illustrating an equivalent circuit in a unit cell.

FIG. 4 is a figure illustrating an equivalent circuit of the unit cell 22. The unit cell 22 comprises Nch transistors Q1, Q2 corresponding to the transistors 16, 18, respectively, as explained in FIG. 1 and a resistor R corresponding to the memory cell contact 20. The Nch transistors Q1, Q2 have drains connected in common to which a bit line signal DGn output by the readout and writing circuit 26 is supplied through the resistor R. The Nch transistors Q1, Q2 also have sources in connected in common to which a source potential signal VGSn output by the VG selector circuit 28 is supplied.

The word line signals WiL, WjU output by the word line driving circuit 24 are supplied to each gate of the Nch transistors Q1, Q2. At the time of writing or readout in/from the memory cell 22, the bit line signal DGn is turned to high-level and the source potential signal VGSn is turned to low-level. At the time of the writing, both word line signals WiL, WjU are turned to high-level to turn both Nch transistors Q1, Q2 on. On the other hand, at the time of the readout, only one of the two word lines is turned high, e.g., the word line signal WjU is turned to high-level, to turn only the Nch transistor Q1 on.

Figure 5:
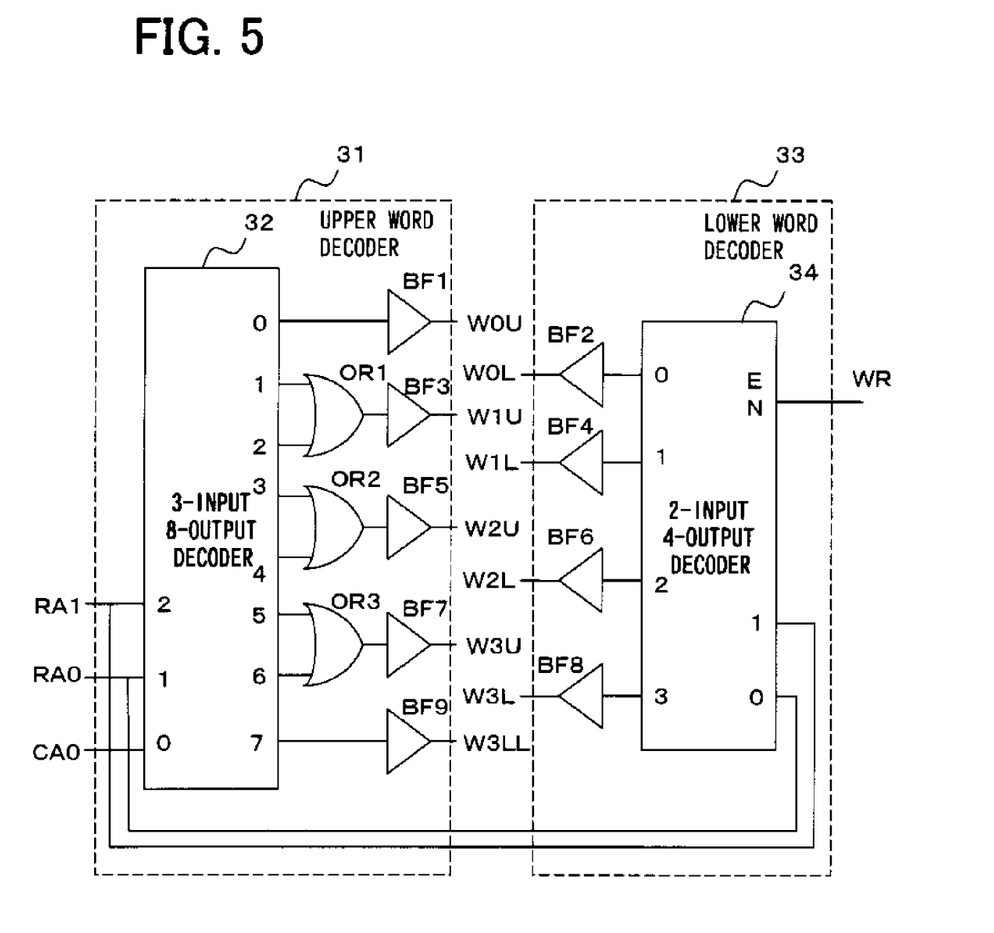
FIG. 5 is a block diagram illustrating a structure of a word line driving circuit according to an example of the present invention.

Next, the word line driving circuit 24 will be explained below in detail. FIG. 5 is a block diagram illustrating the structure of the word line driving circuit according to an example of the present invention. The word line driving circuit comprises an upper word decoder 31 and a lower word decoder 33.

The lower word decoder 33 comprises a 2-input 4-output decoder 34 to which the row addresses RA0, RA1 and the write-enable signal WR are input and buffers BF2, BF4, BF6, BF8, each buffering a decoded output of the 2-input 4-output decoder 34 and output the word line signals W0L-W3L, respectively. At the time of to writing in the memory cell, the write-enable signal WR is turned H-level. The 2-input 4-output decoder 34 turns any one of the word signals W0L-W3L, which are decoded according to the row addresses RA0, RA1, to high-level. When the row addresses RA0, RA1 are LL, HL, LH or HH levels, the word line signals W0L-W3L are turned to HLLL, LHLL, LLHL or LLLH level. At the time of the readout from the memory cell, since the write-enable signal WR is turned to L-level, all word line signals W0L-W3L are turned to L-level.

On the other hand, the upper word decoder 31 comprises a 3-input 8-output decoder 32 to which the row addresses RA0, RA1 and a column address CA0 are input, OR circuits OR1, OR2, OR3 and buffers BF1, BF3, B F5, BF7, BF9. An output terminal 0 of the 3-input 8-output decoder 32 outputs a word line signal W0U through the buffer BF1. Output terminals 1, 2 are connected to input terminals of the OR circuit OR1, respectively, and an output terminal of the OR circuit OR1 outputs a word line signal W1U through the buffer BF3. Output terminals 3, 4 are connected to input terminals of the OR circuit OR2, respectively, and an output terminal of the OR circuit OR2 outputs a word line signal W2U through the buffer BF5. Output terminals 5, 6 are connected to input terminals of the OR circuit OR3, respectively, and an output terminal of the OR circuit OR3 outputs a word line signal W3U through the buffer BF7. An output terminal 7 outputs a word line signal W3LL through the buffer B F9.

Figure 6:
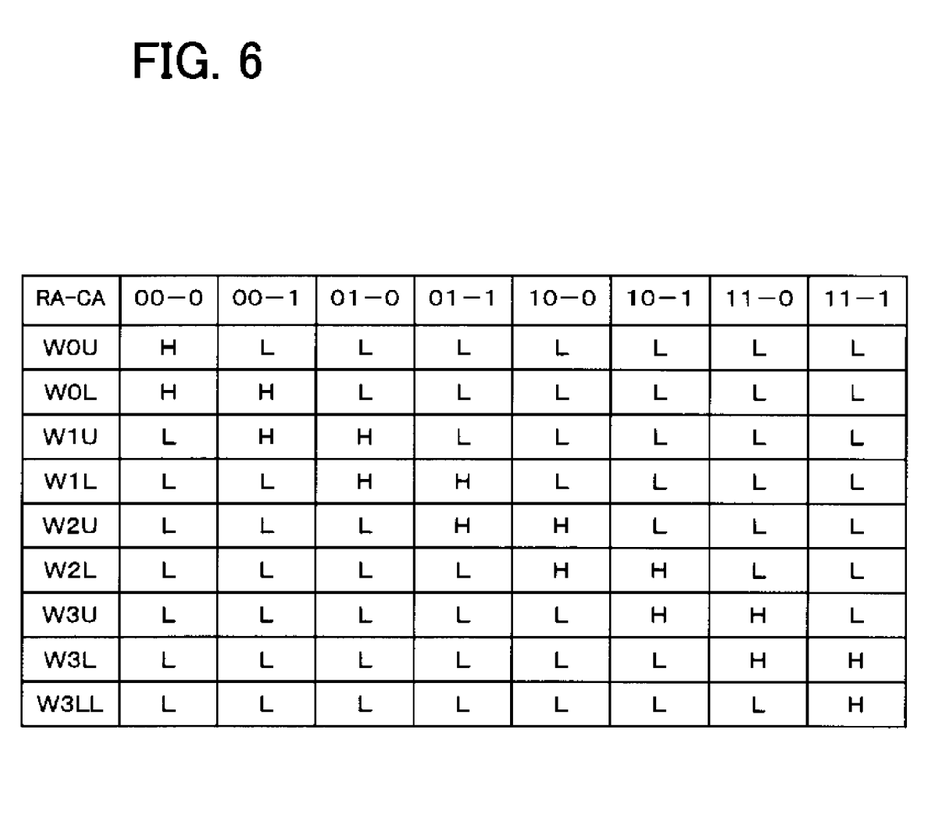
FIG. 6 is a figure showing a list of logic levels of a signal output by a word line driving circuit according to an example of the present invention.

FIG. 6 is a figure showing a list of logic levels of the signals output by the upper word decoder 31 and lower word decoder 33 as structured above. In FIG. 6, "RA-CA" shows a combination of input levels of the row addresses RA0, RA1 and column address CA0, and "H" and "L" show each level of the word line signals W0L-W3L, W0U-W3U and W3LL to this combination. "00-0", for example, shows that all of the row addresses RA0, RA1 and column address CA0 are "0" (low-level), and this results in H-levels of the word line signals W0U, W0L and L-levels of the other word line signals. "00-1" shows that the row addresses RA0, RA1 are "0" (L-level) and that the column address CA0 is "1" (H-level), and this results in H-levels of the word line signals W0L, W1U and L-levels of the other word line signals.

As shown in FIG. 6, in the mode of writing, a pair of word lines to the memory cell is selected by the combination of the row addresses and column address in the upper word decoder 31 and the lower word decoder 33. In the mode of the readout, all word line signals WkL (k is 0 to 3) are turned L-level, and one word line is selected from the word line signals WkU and word line signal W3LL.

Next, an action of the semiconductor memory device will be explained referring to FIG. 3. At first, a condition to turn the unit cell 22a to the writing state will be considered. It is assumed that an even/odd bit line is selected by the lowest address CA0 of the column address in the readout and writing circuit 26. Now, the bit line signal DG0 is selected, and a source potential signal VOS0 is set to a GND level.

When the row addresses and column address are "00-0" shown in FIG. 6, the word line signals W0U, W0L are turned to H-level, and the other word line signals are turned to L-level. The unit cell 22a to which the bit line signal DG0 is supplied from the write-amplifier through the column selector becomes selected to turn only the unit cell 22a writable.

Next, when the row addresses and column address are turned to "00-1" shown in FIG. 6 by the address requirement to select the adjacent cell, the bit line signal DG0 is turned to L-level (a non-active state), the bit line signal DG1 being turned to H-level (an active state), the source potential signal VGS0 becoming an open or precharge level (a non-active state), a source potential signal VGS1 being lowed to the GND level (an active state). As shown in FIG. 6, the word line signal W0U is turned from H-level to L-level, the word line signal W0L maintaining H-level, and the word line signal W1U being turned to H-level. The unit cell 22b thus becomes selectable.

Further, when the row addresses and column address are turned to "11-1" shown in FIG. 6 by the address requirement, both word line signals W0L, W1U are turned to L-level, the word line signals W3L, W3LL being turned to H-level. The unit cell 22c thus becomes selectable.

As explained above, one memory cell is selected by changing the active word lines and bit lines one by one in turn to select the writing and readout in/from the memory cell.

In the above explanation, a method for accessing the memory cell along the adjacent bit lines under the condition that the column address input to the upper word decoder 31 is the lowest address CA0 is explained. The input address is, however, not limited to the address CA0 and may be another address. It is possible, for example, that the readout and writing is performed by only the column address under the condition that the most upper address is selected to determine two word lines, and this have an advantage of high access speed.

The present invention is explained in line with the above example, but not limited to the above example. It is understood that the present invention may include any variation and modification within the scope of the claims which one skilled in the art could achieved.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   memory cells each having a heater element which generates heat by supplying an electric current and a variable resistor element whose phase is changed by heat;
   bit lines each extending in a predetermined direction and electrically connecting with the memory cells; and
   word lines each extending in a direction at right angles to the bit lines and electrically connecting with the memory cells;
   wherein the memory cells are arranged in a checker manner.

2. The semiconductor memory device according to claim 1, further comprising:
   first cell rows in which the memory cells are arranged at a predetermined interval 2d along the extending direction of the bit lines; and
   second cell rows in which the memory cells are arranged such that the first cell row is shifted by a distance d along the extending direction of the bit lines;
   wherein the first cell rows and the second cell rows are alternately arranged at a predetermined interval e along the extending direction of the word lines.

3. The semiconductor memory device according to claim 2, wherein the interval 2d is not less than the interval e.

4. The semiconductor memory device according to claim 2, wherein two or more word lines are arranged within the interval 2d.

5. The semiconductor memory device according to claim 2, wherein:
   the word lines comprise a first word line and a second word line;
   the first word line and second word line are arranged within the interval 2d;
   the memory cell disposed sandwiched between the first and second word lines is connected with the first and second word lines;
   writing into the memory cell is performed through both the first and second word lines; and
   readout from the memory cell is performed through any one of the first and second word lines.

6. The semiconductor memory device according to claim 5, wherein:
   the memory cell further comprises a first switch element and a second switch element for switching power supply to the heater element;
   the first switch element comprises a first controlling terminal;
   the second switch element comprises a second controlling terminal;
   the first controlling terminal of the first switch element is connected with the first word line;
   the second controlling terminal of the second switch element is connected with the second word line; and
   the power is supplied through the bit line.

7. The semiconductor memory device according to claim 5, further comprising a word line driver for driving the memory cells through the word lines; wherein
   the word line driver comprises a first decoder decoding one bit in a row address and column address to access the memory cell selectively and outputting a signal to select one of the first word lines and a second decoder decoding the row address and outputting a signal to select one of the second word lines when a writing signal is active.

8. The semiconductor memory device according to claim 6, further comprising a word line driver for driving the memory cells through the word lines; wherein
   the word line driver comprises a first decoder decoding one bit in a row address and column address to access the memory cell selectively and outputting a signal to select one of the first word lines and a second decoder decoding the row address and outputting a signal to select one of the second word lines when a writing signal is active.

9. The semiconductor memory device according to claim 7, wherein:
  when the row address is k which is 0 to $2^n-1$, n being an integer greater than 1, the numbers of the first word lines being 0 to $2^n$, respectively, the numbers of the second word lines being 0 to $2^n-1$, respectively,
  the first decoder outputs a selection signal to the first word line having any one of the numbers k and k+1 corresponding to 1 bit in the column address, and
  the second decoder outputs a selection signal to the second word line having a number k.

10. The semiconductor memory device according to claim 8, wherein:
  when the row address is k which is 0 to $2^n-1$, n being an integer greater than 1, the numbers of the first word lines being 0 to $2^n$, respectively, the numbers of the second word lines being 0 to $2^n-1$, respectively,
  the first decoder outputs a selection signal to the first word line having any one of the numbers k and k+1 corresponding to 1 bit in the column address, and
  the second decoder outputs a selection signal to the second word line having a number k.

11. A semiconductor memory device comprising:
  memory cells each having a heater element which generates heat by supplying an electric current and a variable resistor element whose phase is changed by heat;
  bit lines each extending in a predetermined direction and electrically connecting with the memory cells; and
  word lines each extending in a direction at right angles to the bit lines and electrically connecting with the memory cells;
  wherein the memory cells are arranged in a checker manner,
  said semiconductor memory device further comprising:
  first cell rows in which the memory cells are arranged at a predetermined interval 2*d* along the extending direction of the bit lines; and
  second cell rows in which the memory cells are arranged such that the first cell row is shifted by a distance d along the extending direction of the bit lines;
  wherein the first cell rows and the second cell rows are alternately arranged at a predetermined interval e along the extending direction of the word lines.

12. A semiconductor memory device comprising:
  memory cells each having a heater element which generates heat by supplying an electric current and a variable resistor element whose phase is changed by heat;
  bit lines each extending in a predetermined direction and electrically connecting with the memory cells; and
  word lines each extending in a direction at right angles to the bit lines and electrically connecting with the memory cells;
  wherein the memory cells are arranged in a checker manner,
  said semiconductor memory device further comprising:
  first cell rows in which the memory cells are arranged at a predetermined interval 2*d* along the extending direction of the bit lines; and
  second cell rows in which the memory cells are arranged such that the first cell row is shifted by a distance d along the extending direction of the bit lines;
  wherein the first cell rows and the second cell rows are alternately arranged at a predetermined interval e along the extending direction of the word lines, and
  wherein the interval 2*d* is not less than the interval e.

* * * * *